United States Patent
Takata

(10) Patent No.: US 7,049,908 B2
(45) Date of Patent: May 23, 2006

(54) SURFACE ACOUSTIC WAVE DEVICE AND COMMUNICATION APPARATUS

(75) Inventor: Toshiaki Takata, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 106 days.

(21) Appl. No.: 10/847,584

(22) Filed: May 18, 2004

(65) Prior Publication Data
US 2005/0025324 A1    Feb. 3, 2005

(30) Foreign Application Priority Data
Jul. 28, 2003   (JP)   ............... 2003-202272

(51) Int. Cl.
*H03H 9/64*    (2006.01)

(52) U.S. Cl. .................. 333/193; 333/194; 333/195

(58) Field of Classification Search ......... 333/193–196
See application file for complete search history.

(56) References Cited

U.S. PATENT DOCUMENTS

| | | | |
|---|---|---|---|
| 4,841,264 A | 6/1989 | Oshikawa | 333/189 |
| 5,471,178 A * | 11/1995 | Hickernell | 333/193 |
| 5,831,493 A * | 11/1998 | Ushiroku | 333/193 |
| 5,963,113 A * | 10/1999 | Ou et al. | 333/193 |
| 6,025,763 A * | 2/2000 | Morimoto | 333/195 |
| 6,137,380 A * | 10/2000 | Ushiroku et al. | 333/193 |
| 6,292,071 B1 * | 9/2001 | Taniguchi | 333/133 |
| 6,518,861 B1 * | 2/2003 | Taniguchi | 333/193 |
| 6,522,219 B1 * | 2/2003 | Takamiya et al. | 333/133 |
| 2003/0227358 A1 | 12/2003 | Inose | 333/193 |

FOREIGN PATENT DOCUMENTS

| | | | |
|---|---|---|---|
| EP | 0 541 284 | 5/1993 | |
| EP | 0 746 095 | 12/1996 | |
| EP | 0 795 958 | 9/1997 | |
| JP | 05-183380 | 7/1993 | |
| JP | 6-61783 | * 3/1994 | ........... 333/193 |
| JP | 08-037438 | 2/1996 | |
| JP | 10-013187 | 1/1998 | |
| JP | 11-163664 | 6/1999 | |
| JP | 11-312951 | 11/1999 | |
| JP | 2002-232264 | 8/2002 | |
| JP | 2003-087096 | 3/2003 | |

OTHER PUBLICATIONS

Hikita, M. et al., "Design Methodology and Synthesis Techniques for Ladder-Type Saw Resonator Coupled Filters," Ultrasonics Symposium, Oct. 1993, pp. 15-24, IEEE Inc., New York, NY, USA.

(Continued)

*Primary Examiner*—Barbara Summons
(74) *Attorney, Agent, or Firm*—Keating & Bennett, LLP

(57) ABSTRACT

A surface acoustic wave device includes one-terminal-pair SAW series resonators and one-terminal-pair SAW parallel resonators arranged in a ladder configuration. Among the series resonators, the resonant frequencies of, for example, two series resonators forming the pass band are lower than the anti-resonant frequency of the parallel resonators forming the pass band. A capacitive area of one of the series resonator is disposed in an inductive area formed by the parallel resonators forming the pass band and the other series resonators forming the pass band.

22 Claims, 20 Drawing Sheets

OTHER PUBLICATIONS

Plessky, V.P., "Saw Impedence Elements," IEEE Transactions on Ultrasonics, Ferroelectrics and Frequency Control, Sep. 1995, pp. 870-875, vol. 42, No. 5, IEEE Inc., New York, NY, USA.

* cited by examiner

SURFACE ACOUSTIC WAVE DEVICE AND COMMUNICATION APPARATUS

BACKGROUND OF THE INVENTION

1. Field of the Invention

The present invention relates to surface acoustic wave (hereinafter referred to as "SAW") devices used as filters which are suitable for narrow-band communication apparatuses. More particularly, the present invention relates to a SAW device using a plurality of ladder-type one-terminal-pair SAW resonators and also to a communication apparatus including such a SAW device.

2. Description of the Related Art

An example of a known SAW device used as a bandpass filter which is suitable for a small communication terminal, such as a cellular telephone, is disclosed in Japanese Unexamined Patent Application Publication No. 5-183380. In this publication, a ladder-type bandpass filter including one-terminal-pair SAW resonators alternately connected to series arms and parallel arms is provided.

In the ladder-type bandpass filter disclosed in the above-mentioned publication, as shown in FIG. 15, first one-terminal-pair SAW resonators 51a, 51b, and 51c are connected in series with each other, and second one-terminal-pair SAW resonators 52a, 52b, 52c, and 52d are connected in parallel with each other. Then, as shown in FIG. 16, the anti-resonant frequency (fap) of the parallel resonators 52a, 52b, 52c, and 52d is allowed to substantially coincide with the resonant frequency (frs) of the series resonators 51a, 51b, and 51c. The resulting ladder-type filter exhibits very good characteristics, for example, low loss and a wider band, and is thus widely used, mainly, as a communication filter.

The above-described publication also discloses that a wider bandwidth can be obtained by setting the resonant frequency (frs) of the series resonators 51a, 51b, and 51c to be higher than the anti-resonant frequency (fap) of the parallel resonators 52a, 52b, 52c, and 52d.

However, wider bandwidth filter characteristics are not always suitable, and the bandwidth should be determined according to the specifications of the filter.

As shown in FIGS. 17 and 18, filter characteristics having narrow bandwidths are necessary for Global Positioning System (GPS) or Time Division Synchronous Code Division Multiple Access (TDS-CDMA) filters, respectively. Personal Handyphone System (PHS) or Personal Digital Cellular (PDC) filters also require narrow bandwidths. The pass bands of GPS, TDS-CDMA, PHS, and PDC filters can be indicated in terms of the bandwidth ratio as 0.2%, 0.7%, 1.8%, and 1.7%, respectively. The bandwidth ratio is the ratio determined by dividing the pass bandwidth by the corresponding central frequency. The bandwidth ratios of other existing filter specifications such as PCS, Digital Command Signal (DCS), and Wideband CDMA (WCDMA) filters are 3.1%, 4.1%, and 2.8%, respectively.

Wider bands are demanded for the filters of the second group, and thus, the design type disclosed in the above-described publication is desirable for such filters. However, for the filters of the first group, narrower bands are demanded, and thus, a known design type, such as that disclosed in the above-described publication, is not desirable. At present, there is no suitable design type for filters of the first group, and more specifically, for filters having a bandwidth ratio of 2.5% or lower.

A narrower bandwidth in accordance with the corresponding specification can be adjusted to a certain degree by changing the type of piezoelectric substrate or decreasing the thickness of a piezoelectric substrate. However, in the above-described known design type, there are limitations to making such adjustments. In particular, for high frequency filters having a central frequency higher than 1.5 GHz, the substrate is already thin because of the high frequency, and a further decrease in the thickness of the substrate in order to obtain narrow-band characteristics results in an increased ohmic loss. It is thus necessary that narrow-band characteristics be obtained without making the substrate very thin.

Thus, according to the above-described design type, a narrower bandwidth increases the insertion loss. More specifically, the above publication discloses that a wider bandwidth can be obtained by setting the resonant frequency (frs) of the series resonators 51a, 51b, and 51c to be higher than the anti-resonant frequency (fap) of the parallel resonators 52a, 52b, 52c, and 52d. Conversely, as shown in FIG. 19, it can be considered that a narrower bandwidth is obtained if the resonant frequency (frs) of the series resonators 51a, 51b, and 51c is set to be lower than the anti-resonant frequency (fap) of the parallel resonators 52a, 52b, 52c, and 52d. However, an ideal narrow bandwidth cannot be obtained.

FIG. 20 illustrates comparison results of transmission characteristics when the anti-resonant frequency is substantially equal to the resonant frequency, i.e., fap≈frs, and when the anti-resonant frequency is greater than the resonant frequency, i.e., fap>frs. FIG. 20 shows that the insertion loss of the entire pass band is considerably increased when fap>frs. Accordingly, even though the resonant frequency (frs) of the series resonators 51a, 51b, and 51c is set to be lower than the anti-resonant frequency (fap) of the parallel resonators 52a, 52b, 52c, and 52d, it is difficult to decrease the pass bandwidth without increasing the insertion loss.

One way to solve this problem is disclosed in Japanese Unexamined Patent Application Publication No. 11-163664. The number of electrode fingers is reduced so as to decrease the frequency interval between the resonant frequency and the anti-resonant frequency, thereby making the bandwidth narrower.

However, a smaller frequency interval between the resonant frequency and the anti-resonant frequency decreases the impedance at the anti-resonant frequency so as to reduce the Q factor. Thus, the pass bandwidth can be decreased, but on the other hand, the insertion loss is increased.

Japanese Unexamined Patent Application Publication No. 10-13187 discloses a technique for suppressing increased insertion loss in the lower frequency range of the pass band by providing a capacitive device or an inductive device for inhibiting mismatch loss between the stages.

However, this is not a suitable technique for decreasing the pass bandwidth. Thus, the configuration and the concept disclosed in that publication are different from those of the present invention.

Japanese Unexamined Patent Application Publication No. 2002-232264 discloses a technique for increasing the attenuation in the lower frequency range of the pass band by setting the anti-resonant frequency of one series resonator to be lower than the resonant frequency of parallel resonators.

However, this is not a suitable technique for decreasing the pass bandwidth. This is merely a technique for increasing the attenuation in the lower frequency range of the pass band by setting the anti-resonant frequency of parallel resonators to be equal to the resonant frequency of series resonators, unlike the present invention in which the resonant frequency of the series resonators is set to be lower than the anti-resonant frequency of the parallel resonators. Thus, the configuration and the concept disclosed in that publication are different from those of the present invention.

Japanese Unexamined Patent Application Publication No. 11-312951 discloses the following technique. A plurality of SAW resonators including at least one resonator whose resonant frequency is different from that of the other resonators are connected in series with a series arm. A plurality of SAW resonators including at least one resonator whose resonant frequency is different from that of the other resonators are connected in parallel with a parallel arm. With this configuration, the pass band is decreased.

According to the technique disclosed in this publication, however, the difference Δf between the resonant frequency and the anti-resonant frequency is made smaller by setting the anti-resonance point of the parallel resonators to be substantially equal to the resonance point of the series resonators, thereby decreasing the pass bandwidth. Thus, bottom characteristics are deteriorated, or large ripples occur in the vicinity of the pass band.

SUMMARY OF THE INVENTION

In order to overcome the problems described above, preferred embodiments of the present invention provide a smaller-ripple and lower-insertion-loss SAW device that exhibits an excellent voltage standing wave ratio (VSWR) characteristic and achieves a narrow pass bandwidth without considerably changing the type or thickness of the piezoelectric substrate by setting the resonant frequency of series resonators to be lower than the anti-resonant frequency of parallel resonators and also by setting the resonant frequency of part of the series resonators or the anti-resonant frequency of part of the parallel resonators to within a certain range, and also provide a communication apparatus including such a SAW device.

According to a preferred embodiment of the present invention, a SAW device includes series SAW resonators and parallel SAW resonators, the series SAW resonators and the parallel SAW resonators being arranged in a ladder configuration. The resonant frequency of at least one of the series SAW resonators forming a pass band is lower than the anti-resonant frequency of at least one of the parallel SAW resonators forming the pass band. With this configuration, the pass bandwidth can be made narrower. In an inductive area formed by at least one of the series SAW resonators forming the pass band and at least one of the parallel SAW resonators forming the pass band, a capacitive area of at least one of the series SAW resonators that is different from the above-described one of the series SAW resonators forming the pass band or a capacitive area of at least one of the parallel SAW resonators that is different from the above-described one of the parallel SAW resonators forming the pass band is disposed. With this configuration, the insertion loss is not increased.

According to another preferred embodiment of the present invention, a SAW device includes series SAW resonators and parallel SAW resonators, the series SAW resonators and the parallel SAW resonators being arranged in a ladder configuration. The resonant frequency of at least one of the series SAW resonators forming a pass band is lower than the anti-resonant frequency of at least one of the parallel SAW resonators forming the pass band. With this configuration, the pass bandwidth can be made narrower. Between the resonant frequency of at least one of the series SAW resonators forming the pass band and the anti-resonant frequency of at least one of the parallel SAW resonators forming the pass band, a capacitive area of at least one of the series SAW resonators that is different from the above-described one of the series SAW resonators forming the pass band or a capacitive area of at least one of the parallel SAW resonators that is different from the above-described one of the parallel SAW resonators forming the pass band is disposed. With this configuration, the insertion loss is not increased.

In the aforementioned SAW device, the resonant frequency of part of the series SAW resonators may be higher than or equal to the anti-resonant frequency of the parallel SAW resonators forming the pass band.

In the aforementioned SAW device, the resonant frequency of part of the series SAW resonators may be higher than or equal to the anti-resonant frequency of the series SAW resonators forming the pass band.

In the aforementioned SAW device, the resonant frequency of part of the parallel SAW resonators may be higher than or equal to the anti-resonant frequency of the series SAW resonators forming the pass band.

In the aforementioned SAW device, the anti-resonant frequency of part of the parallel SAW resonators may be lower than or equal to the resonant frequency of the series SAW resonators forming the pass band.

In the aforementioned SAW device, the anti-resonant frequency of part of the series SAW resonators may be lower than or equal to the resonant frequency of the parallel SAW resonators forming the pass band.

In the aforementioned SAW device, the anti-resonant frequency of part of the parallel SAW resonators may be lower than or equal to the resonant frequency of the parallel SAW resonators forming the pass band.

In the aforementioned SAW device, the anti-resonant frequency of a first part of the series SAW resonators may be lower than or equal to the resonant frequency of the parallel SAW resonators forming the pass band. The resonant frequency of a second part of the series SAW resonators that is different from the first part of the series SAW resonators may be higher than or equal to the anti-resonant frequency of the series SAW resonators forming the pass band.

In the aforementioned SAW device, the resonant frequency of a first part of the parallel SAW resonators may be higher than or equal to the anti-resonant frequency of the series SAW resonators forming the pass band. The anti-resonant frequency of a second part of the parallel SAW resonators that is different from the first part of the parallel SAW resonators may be lower than or equal to the resonant frequency of the parallel SAW resonators forming the pass band.

In the aforementioned SAW device, the resonant frequency of part of the series SAW resonators may be higher than or equal to the anti-resonant frequency of the series SAW resonators forming the pass band. The anti-resonant frequency of part of the parallel SAW resonators may be lower than or equal to the resonant frequency of the parallel SAW resonators forming the pass band.

In the aforementioned SAW device, the resonant frequency of part of the parallel SAW resonators may be higher than or equal to the anti-resonant frequency of the series SAW resonators forming the pass band. The anti-resonant frequency of part of the series SAW resonators may be lower than or equal to the resonant frequency of the parallel SAW resonators forming the pass band.

According to a further preferred embodiment of the present invention, a communication apparatus includes any one of the SAW devices according to the preferred embodiments of the present invention described above. Since the communication apparatus includes a SAW device that achieves a narrower bandwidth without increasing the insertion loss, the communication characteristics of the communication apparatus can be improved.

Other features, elements, characteristics and advantages of the present invention will become more apparent from the following detailed description thereof with reference to the attached drawings.

DETAILED DESCRIPTION OF PREFERRED EMBODIMENTS

The present invention is described in detail below with reference to FIGS. 1 through 14 through illustration of preferred embodiments.

First Preferred Embodiment

Figure 1A:
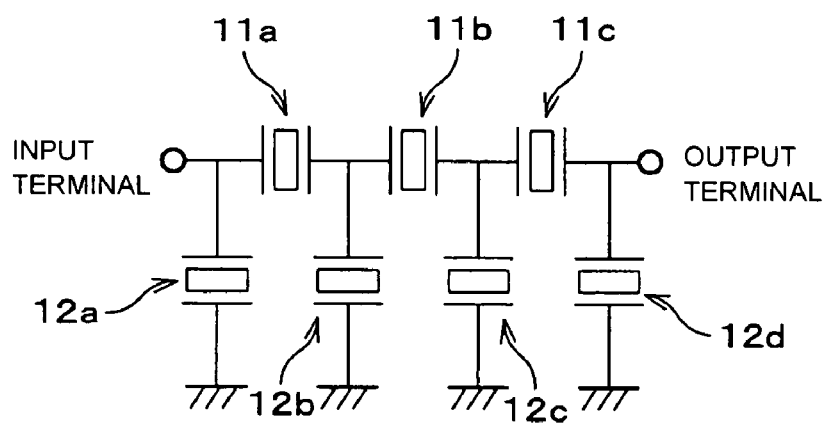
FIG. 1A is a block diagram illustrating a SAW device according to a first preferred embodiment of the present invention.
Figure 2:
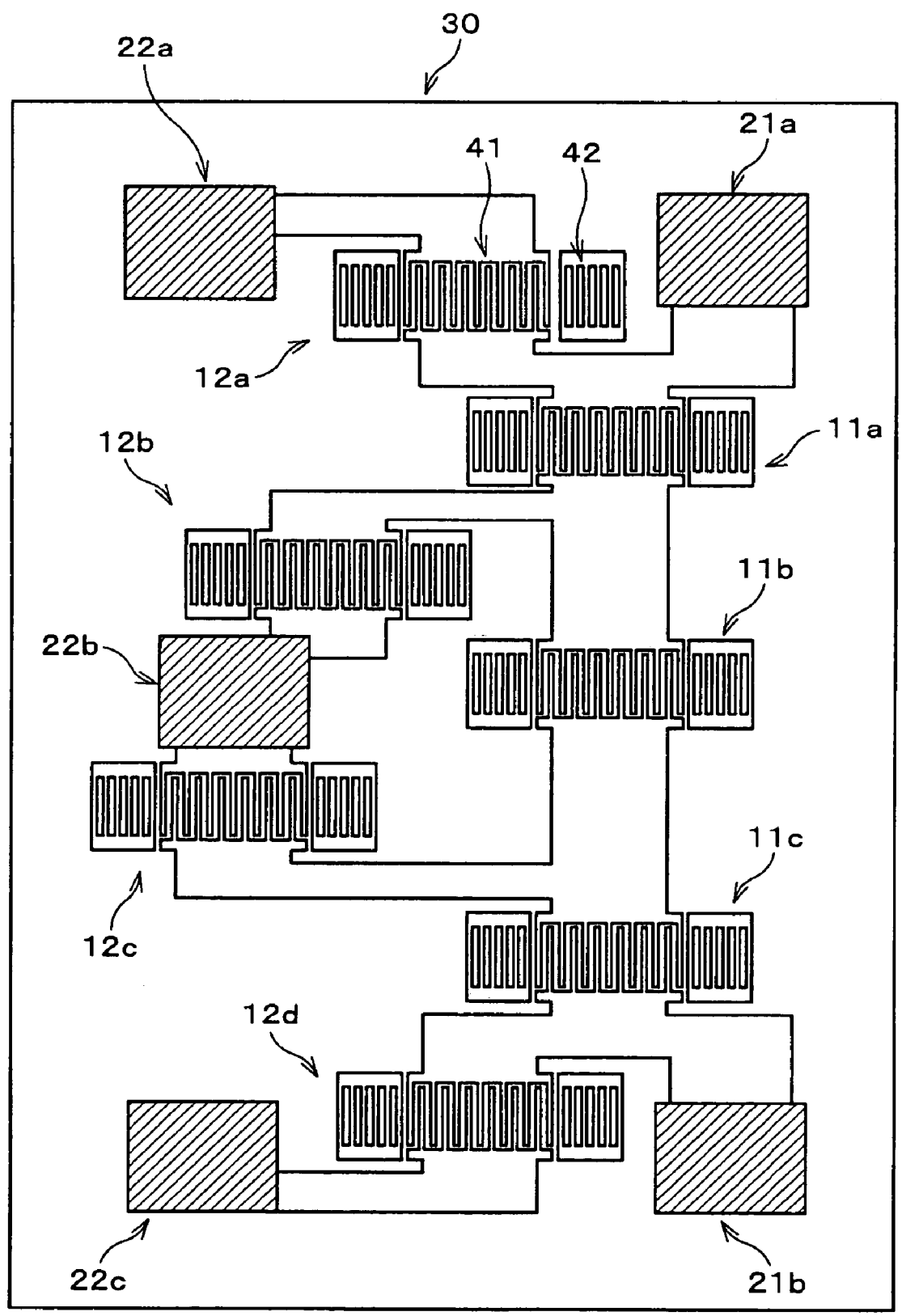
FIG. 2 is a schematic plan view illustrating the SAW device shown in FIG. 1A.
Figure 15:
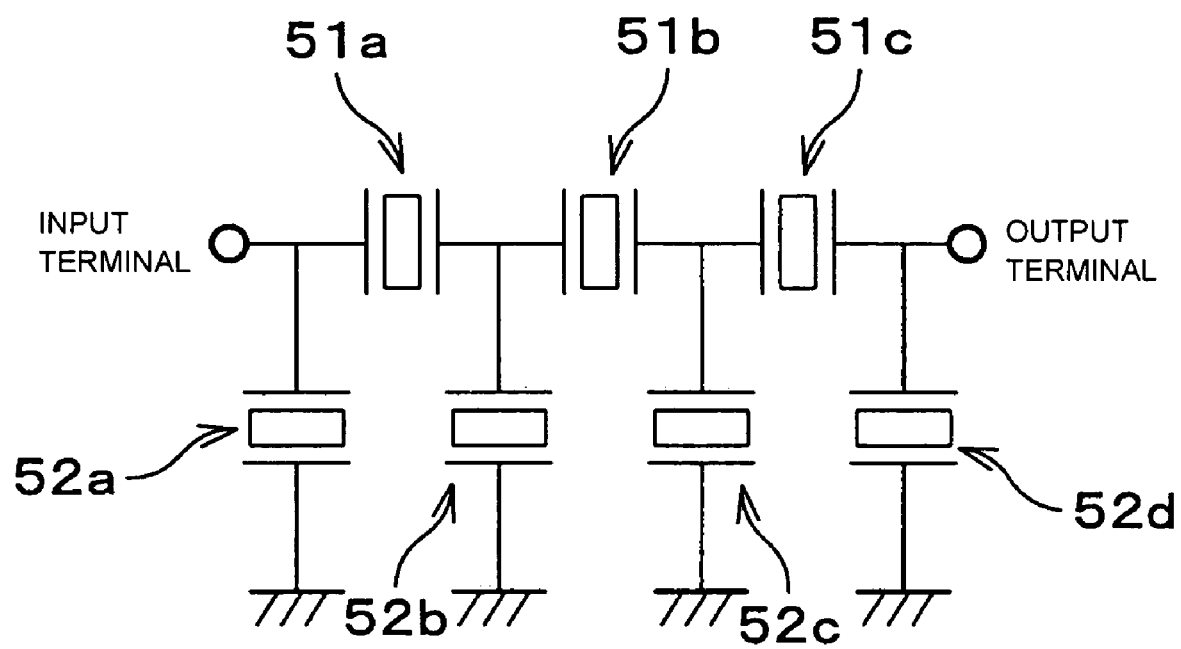
FIG. 15 is a block diagram illustrating a known SAW device.
Figure 16:
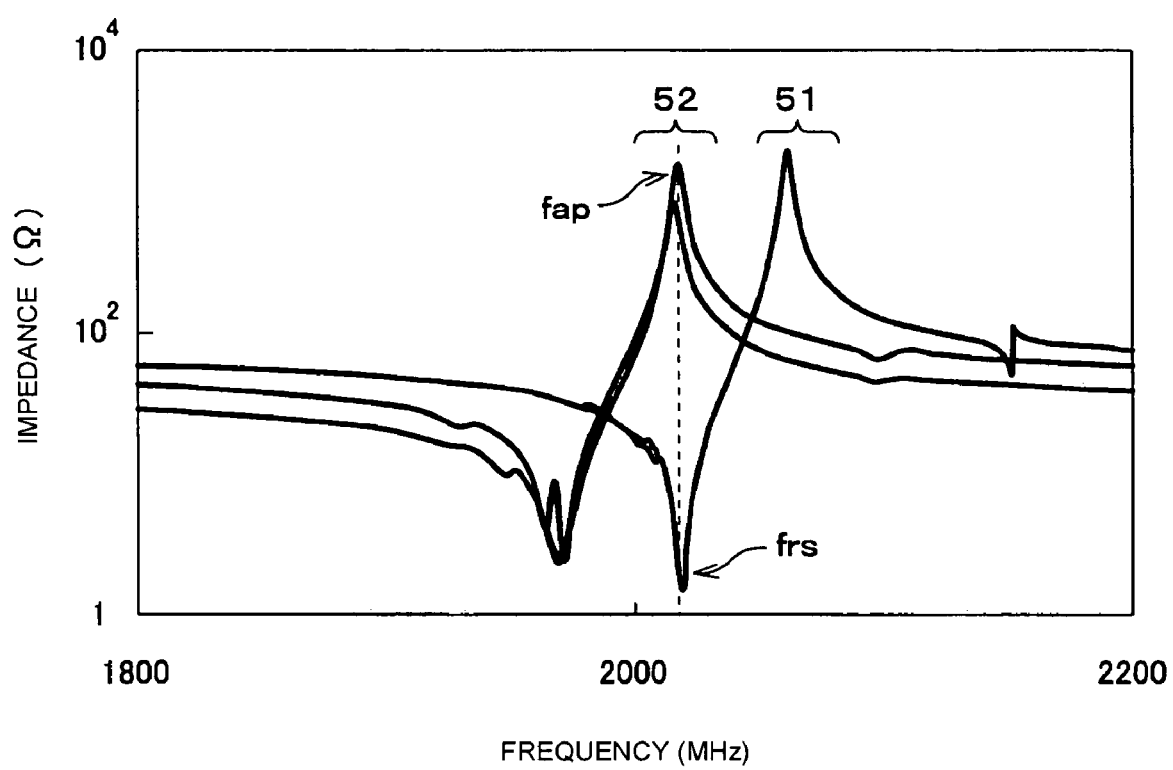
FIG. 16 is a diagram illustrating an example of the impedance characteristics of the resonators used in the known SAW device.
Figure 17:
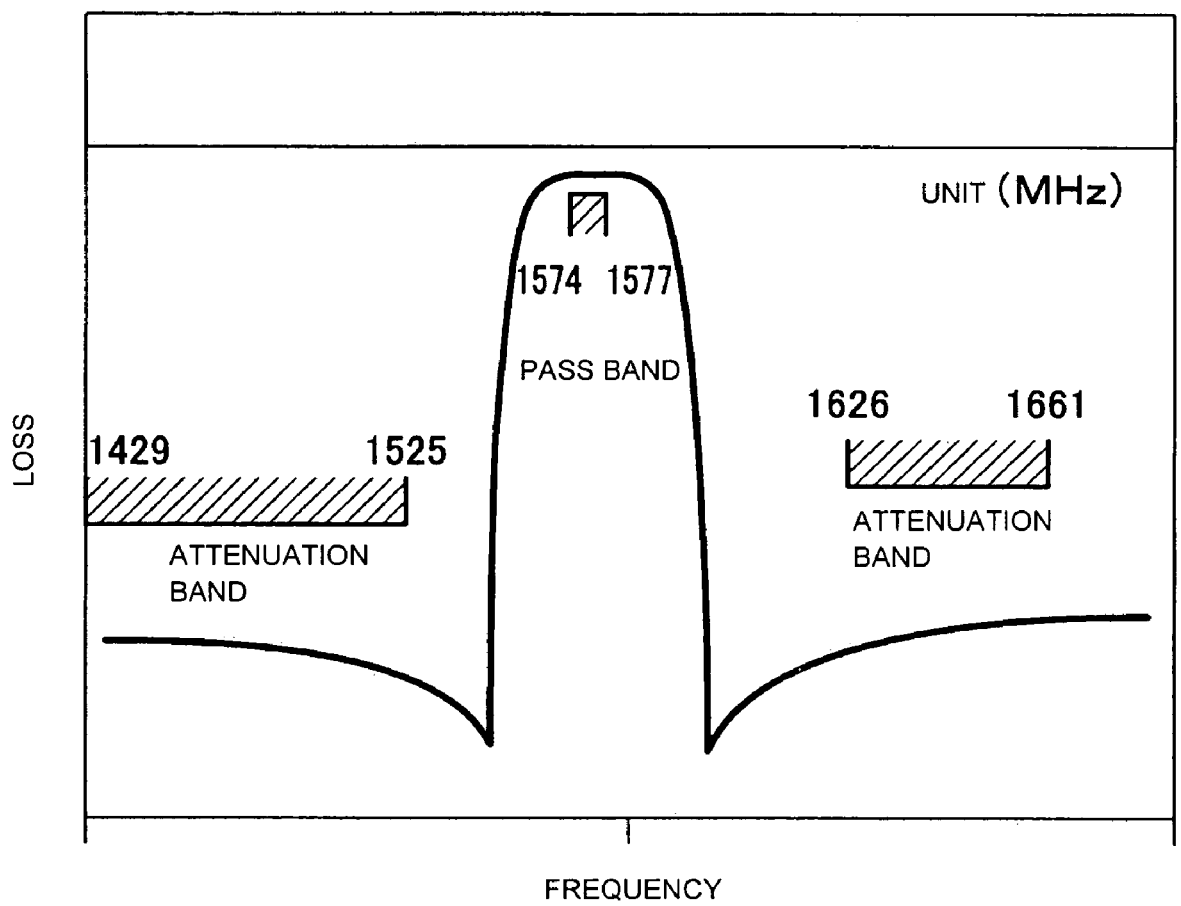
FIG. 17 is a diagram illustrating the frequency band of a GPS filter.
Figure 18:
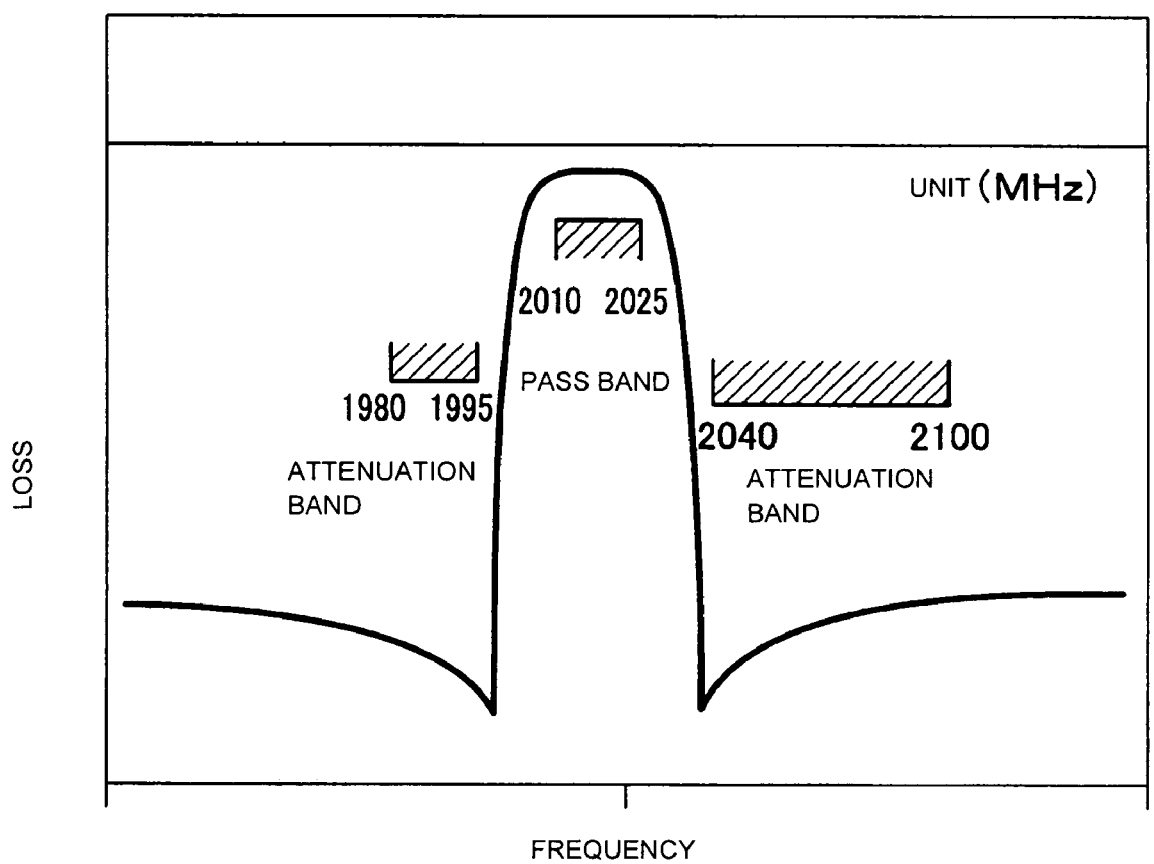
FIG. 18 is a diagram illustrating the frequency band of a TDS-CDMA filter.
Figure 19:
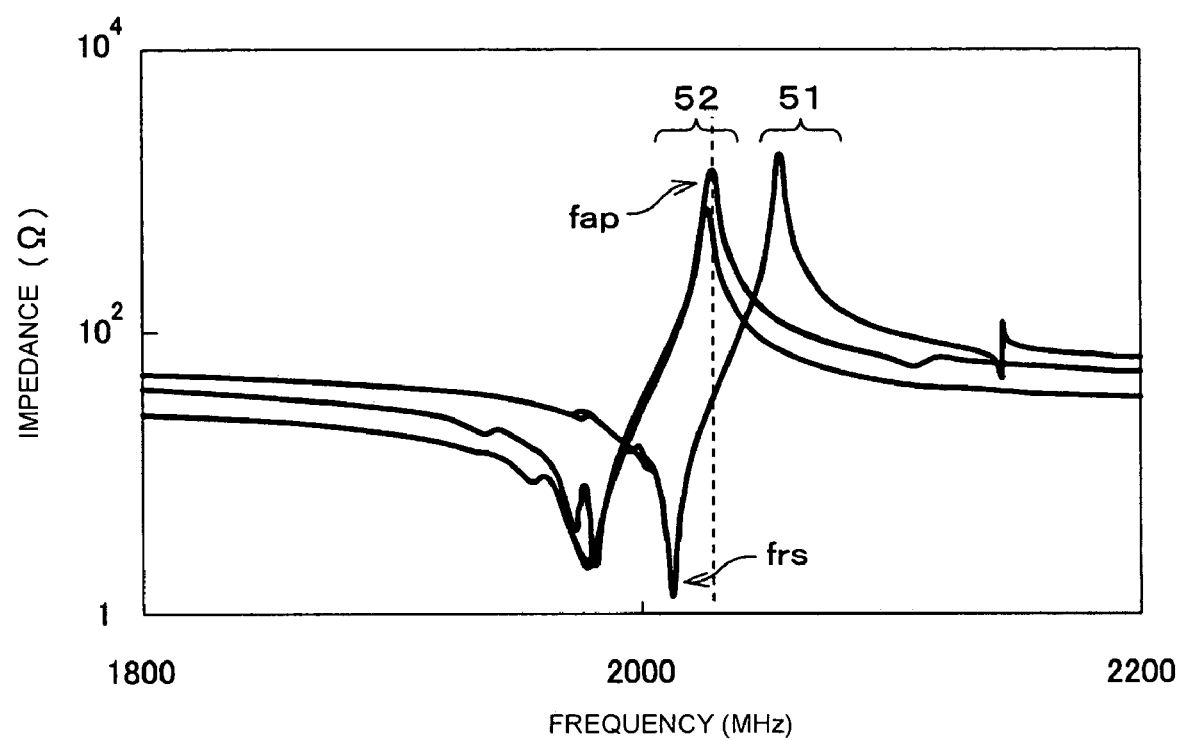
FIG. 19 is a diagram illustrating another example of the impedance characteristics of a known SAW device.

A SAW device constructed in accordance with a first preferred embodiment of the present invention is described below in the context of a TDS-CDMA ladder-type filter having a central frequency of 2017.5 MHz. FIG. 2 is a schematic plan view illustrating one-terminal-pair SAW resonators, which defines one filter, on a piezoelectric substrate 30 of the SAW device of the first preferred embodiment. The circuit configuration of this SAW device is similar, as shown in FIG. 1A, to that shown in FIG. 15.

In the first preferred embodiment, on the piezoelectric substrate 30 formed of, for example, a 36°-Y-cut X-propagating LiTaO$_3$ chip, a plurality of (for example, three) one-terminal-pair SAW resonators (hereinafter referred to as "series resonators") 11a, 11b, and 11c connected in series with each other and a plurality of (for example, four) one-terminal-pair SAW resonators (hereinafter referred to as "parallel resonators") 12a, 12b, 12c, and 12d connected in parallel with each other are combined and arranged in a ladder configuration.

Input/output terminal pads 21a and 21b and ground terminal pads 22a, 22b, and 22c are also disposed on the piezoelectric substrate 30. The above-described resonators and the terminal pads are preferably formed of a highly conductive metal, for example, aluminum, by a lift-off process. The terminal pads on the piezoelectric substrate 30 are electrically connected to packages via conductive bumps by face down bonding, for example.

The parallel resonator 12a is a one-terminal-pair SAW resonator having a structure in which an interdigital transducer (hereinafter referred to as an "IDT") 41 is disposed at the approximate center and reflectors 42 are disposed such that they sandwich the IDT 41 therebetween. The other resonators, i.e., the parallel resonators 12b, 12c, and 12d and the series resonators 11a, 11b, and 11c are also one-terminal-pair SAW resonators having a structure similar to that of the parallel resonator 12a.

Figure 1B:
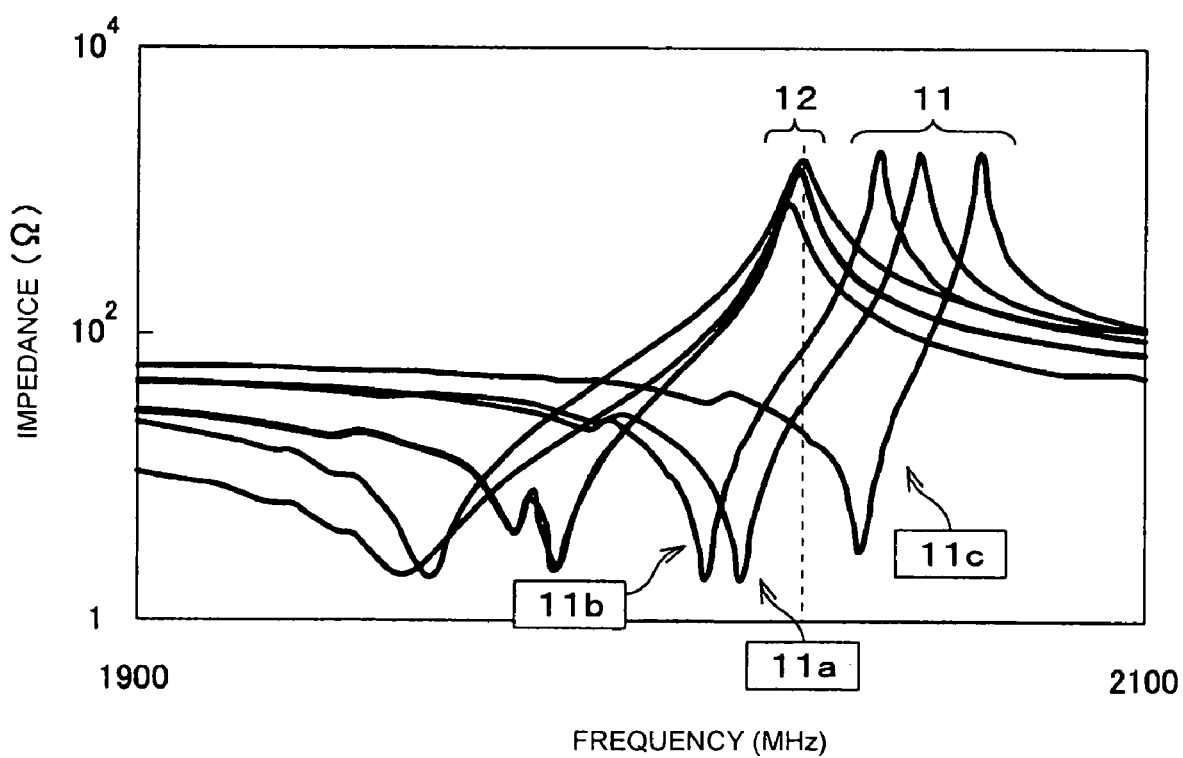
FIG. 1B is a diagram illustrating the impedance characteristics of the resonators used in the SAW device shown in FIG. 1A.

In this preferred embodiment, as shown in FIG. 1B, among the series resonators 11a, 11b, and 11c (hereinafter the three series resonators may be referred to as a "series resonator group"), the resonant frequencies of, for example, the series resonators 11a and 11b forming the pass band are preferably set to be lower than the anti-resonant frequencies of the parallel resonators 12a, 12b, 12c, and 12d (hereinafter the four parallel resonators may be referred to as a "parallel resonator group") forming the pass band. Also, in an inductive area between the resonant frequency of the series resonators 11a and 11b and the anti-resonant frequency of the parallel resonator group, a capacitive area of one of the series resonators, for example, the series resonator 11c, is set. In FIG. 1B, the parallel resonator group is indicated by reference numeral 12, and the series resonator group is indicated by reference numeral 11. The same applies to the following diagrams indicating the impedance characteristics.

Figure 3:
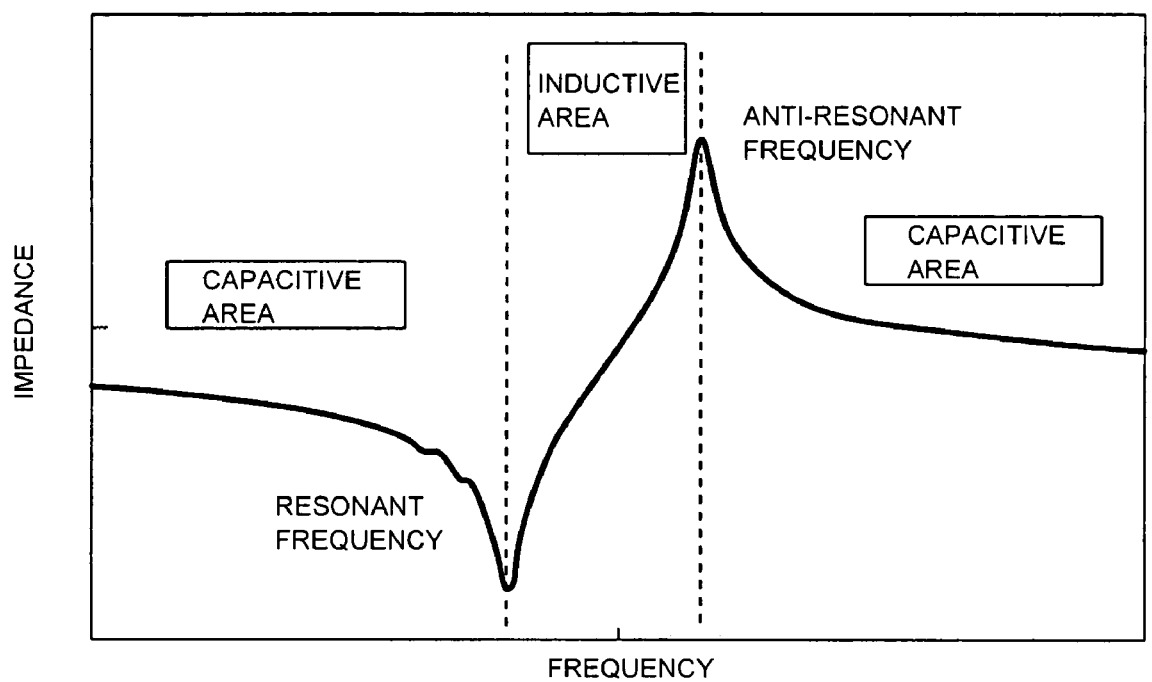
FIG. 3 is a diagram illustrating the impedance characteristic for capacitive areas and an inductive area in the resonators used in the SAW device shown in FIG. 1A.

The above-described inductive area and the capacitive area are defined by the impedance characteristic of the one-terminal-pair SAW resonators shown in FIG. 3. The above-described inductive area is sandwiched by the capacitive areas in the higher and lower frequency ranges. Accordingly, in the above-described inductive area, the capacitive area only in the lower frequency range due to the series resonator 11c is disposed.

Examples of the design parameters of the resonators are as follows. Concerning the IDTs of the series resonators 11a, 11b, and 11c, the electrode pitches are about 1.932 μm, about 1.939 μm, and about 1.911 μm, respectively, the interdigital lengths (which is the length by which interdigitated electrode fingers face each other) are about 26 μm, about 26 μm, and about 16 μm, respectively, and the numbers of pairs of electrode fingers are 43, 43, and 43, respectively. Concerning the IDTs of the parallel resonators 12a, 12b, 12c, and 12d, the electrode pitches are about 1.974 μm, about 1.998 μm, about 1.998 μm, and about 1.974 μm, respectively, the interdigital lengths are about 58.8 μm, about 53.7 μm, about 27.8 μm, and about 56.7 μm, respectively, and the numbers of pairs of electrode fingers are 36, 90, 90, and 36, respectively. The average ratio of the thickness of the electrode to the wavelength in the resonators is about 8.3%.

The above-described parameters are examples only, and the thickness of the substrate or the duty ratio may be changed, or the parasitic inductance or the bridge capacitance may be changed as long as the resonant frequencies and the anti-resonant frequencies of the resonators can be adjusted to desired values. Also, in this preferred embodiment, a 36°-Y-cut X-propagating $LiTaO_3$ substrate is preferably used as the piezoelectric substrate 30. However, the type of piezoelectric substrate is not limited in implementing the present invention. For example, another type of piezoelectric substrate, such as a 38–46°-Y-cut X-propagating $LiTaO_3$ substrate or a 64–72°-$LiNbO_3$ substrate, may be used, in which case, advantages of the present invention can also be achieved. The electrodes may be formed by a process other than the lift-off process, for example, an etching process.

Figure 4:
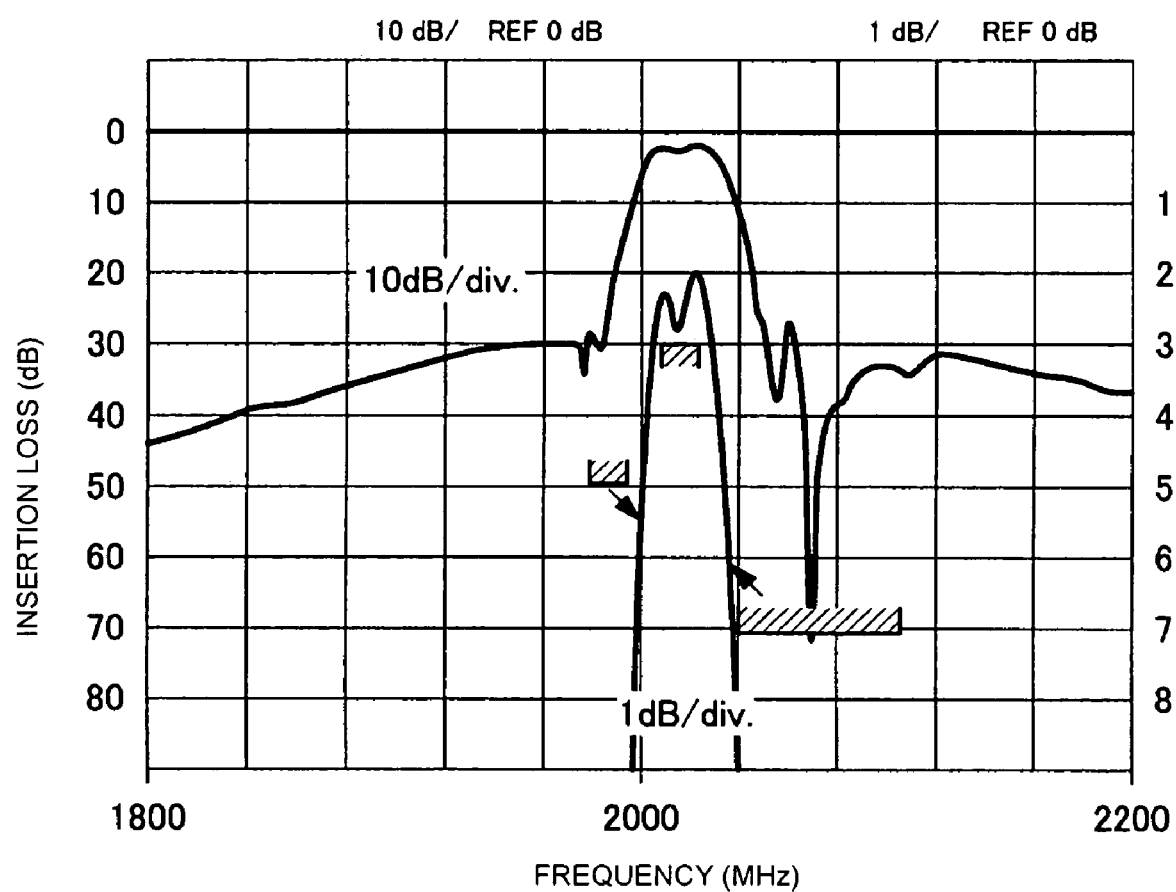
FIG. 4 is a diagram illustrating the transmission characteristic of the SAW device of the first preferred embodiment of the present invention.
Figure 5:
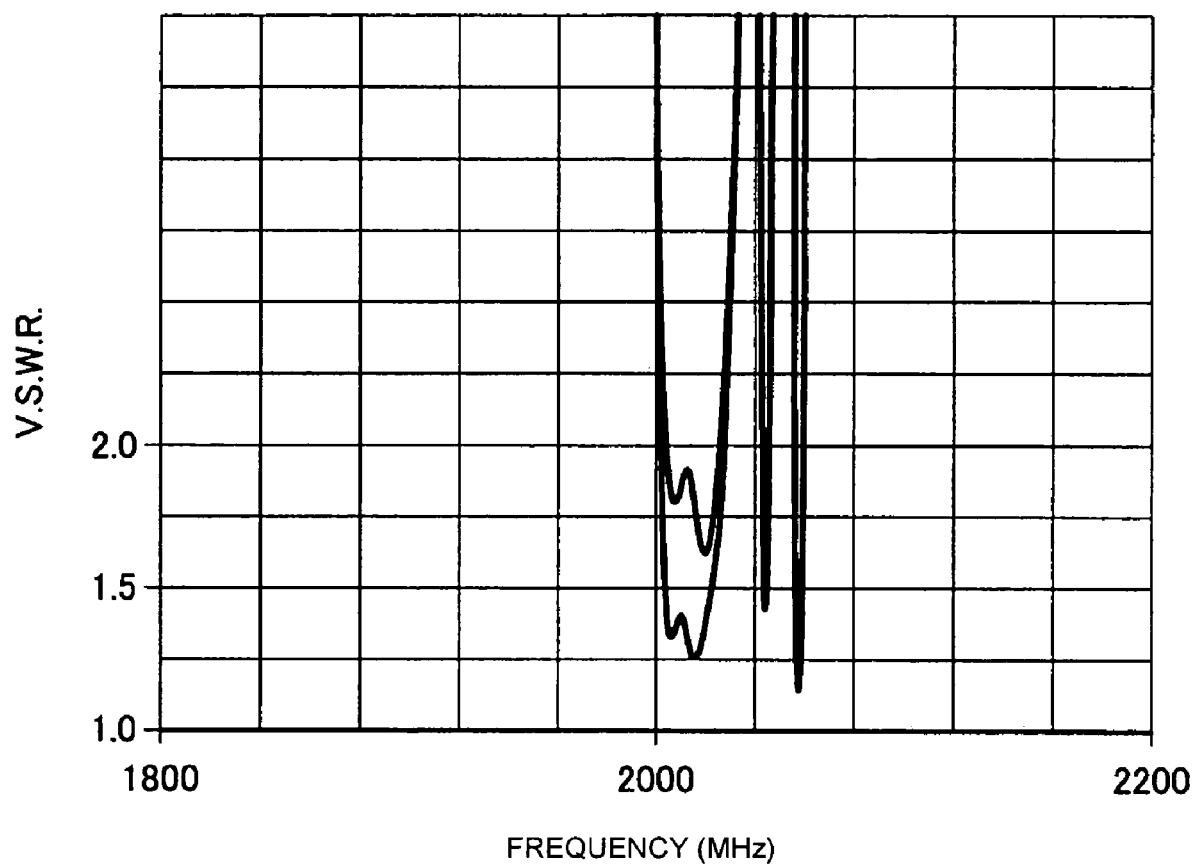
FIG. 5 is a diagram illustrating the VSWR characteristic of the SAW device of the first preferred embodiment of the present invention.
Figure 20:
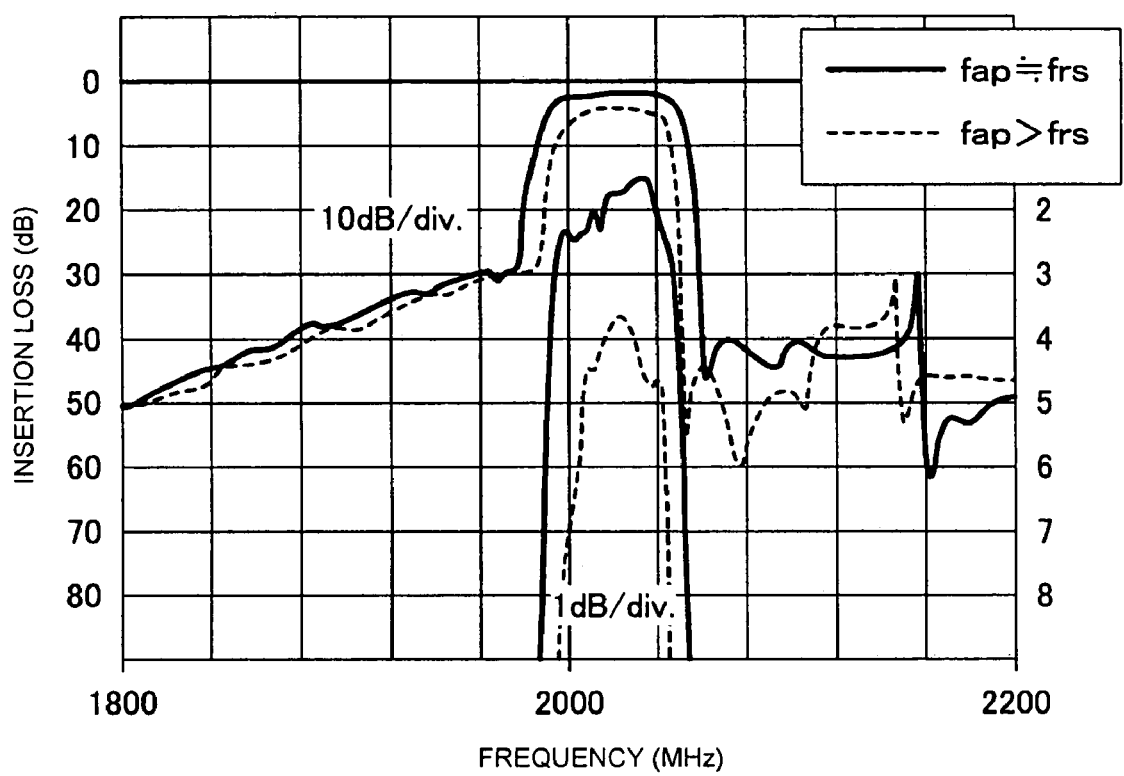
FIG. 20 is a diagram illustrating the transmission characteristics resulting from the impedance characteristics shown in FIGS. 16 and 19.

The transmission characteristic and the VSWR characteristic of the first preferred embodiment using the above-described parameters are shown in FIGS. 4 and 5, respectively. The VSWR characteristic becomes better as the ratio becomes closer to 1.0. The transmission characteristic shown in FIG. 4 indicates that a sufficiently narrow band is obtained with a small insertion loss in the pass band. In comparison with the characteristic shown in FIG. 20 resulting from the known design type (fap≈frs), the bandwidth becomes 25 MHz for an insertion loss of 3 dB in this preferred embodiment. This means that the bandwidth is reduced by about 26.1 MHz from about 51.1 MHz of the bandwidth according to the know design type. FIG. 5 shows that the VSWR characteristic is about 2.0 or lower in the pass band, which is a sufficient level satisfying commercial requirements.

FIG. 1B shows that the resonant frequencies of the series resonators 11a and 11b forming the pass band are set to be lower than the anti-resonant frequencies of the parallel resonator group forming the pass band, and that the resonant frequency of only the series resonator 11c is set to be equal to, and more preferably, higher than the anti-resonant frequency of the parallel resonator group forming the pass band.

The reason for setting the relationship between the resonant frequency and the anti-resonant frequency as described above is as follows. In one-terminal-pair SAW resonators, as shown in FIG. 3, the frequency range lower than the resonant frequency and the frequency range higher than the anti-resonant frequency become capacitive, and the frequency range between the resonant frequency and the anti-resonant frequency becomes inductive.

If the anti-resonant frequency is set to be higher than the resonant frequency, i.e., if fap>frs, so as to make the pass bandwidth narrower, an inductive area is formed between fap and frs for both the parallel resonators and the series resonators. As a result, the impedance in the pass band greatly deviates from a target value, for example, about 50 Ω, thereby increasing the insertion loss.

Accordingly, the resonant frequency or the anti-resonant frequency of the series resonator 11c is adjusted so that the capacitive area of the series resonator 11c matches the inductive area in the pass band. Then, improved transmission characteristics, such as low insertion loss, can be obtained while setting a narrow pass bandwidth.

Alternatively, the anti-resonant frequency of the series resonator 11c may be disposed between the resonant frequency of the parallel resonator group forming the pass band and the resonant frequency of the series resonators 11a and 11b forming the pass band, in which case, a narrow pass bandwidth can also be obtained. With this configuration, however, the anti-resonant frequency of the series resonator 11c is located in the pass band, which considerably increases the insertion loss at the left shoulder of the pass band.

According to the above-configured ladder-type SAW device of the first preferred embodiment, it is possible to provide a SAW filter having a lower insertion loss and a narrower pass bandwidth than known SAW filters.

Second Preferred Embodiment

A ladder-type SAW device constructed in accordance with a second preferred embodiment of the present invention is described below in the context of a TDS-CDMA filter having a central frequency of 2017.5 MHz. The circuit configuration, the piezoelectric substrate, and the electrode forming method are similar to those of the first preferred embodiment described above. Elements having functions similar to those of the first preferred embodiment are indicated by like reference numerals and like names, and a detailed explanation thereof is thus omitted.

The design parameters of the resonators are as follows. Concerning the IDTs of the series resonators 11a, 11b, and 11c, the electrode pitches are about 1.932 μm, about 1.939 μm, and about 1.831 μm, respectively, the interdigital lengths are about 26 μm, about 26 μm, and about 36 μm, respectively, and the numbers of pairs of electrode fingers are 43, 43, and 43, respectively.

Concerning the IDTs of the parallel resonators 12a, 12b, 12c, and 12d, the electrode pitches are about 1.974 μm, about 1.998 μm, about 1.998 μm, and about 1.974 μm, respectively, the interdigital lengths are about 58.8 μm, about 53.7 μm, about 27.8 μm, and about 56.7 μm, respectively, and the numbers of pairs of electrode fingers are 36, 90, 90, and 36, respectively. The impedance characteristic of the second preferred embodiment using these parameters is shown in FIG. 6.

Figure 7:
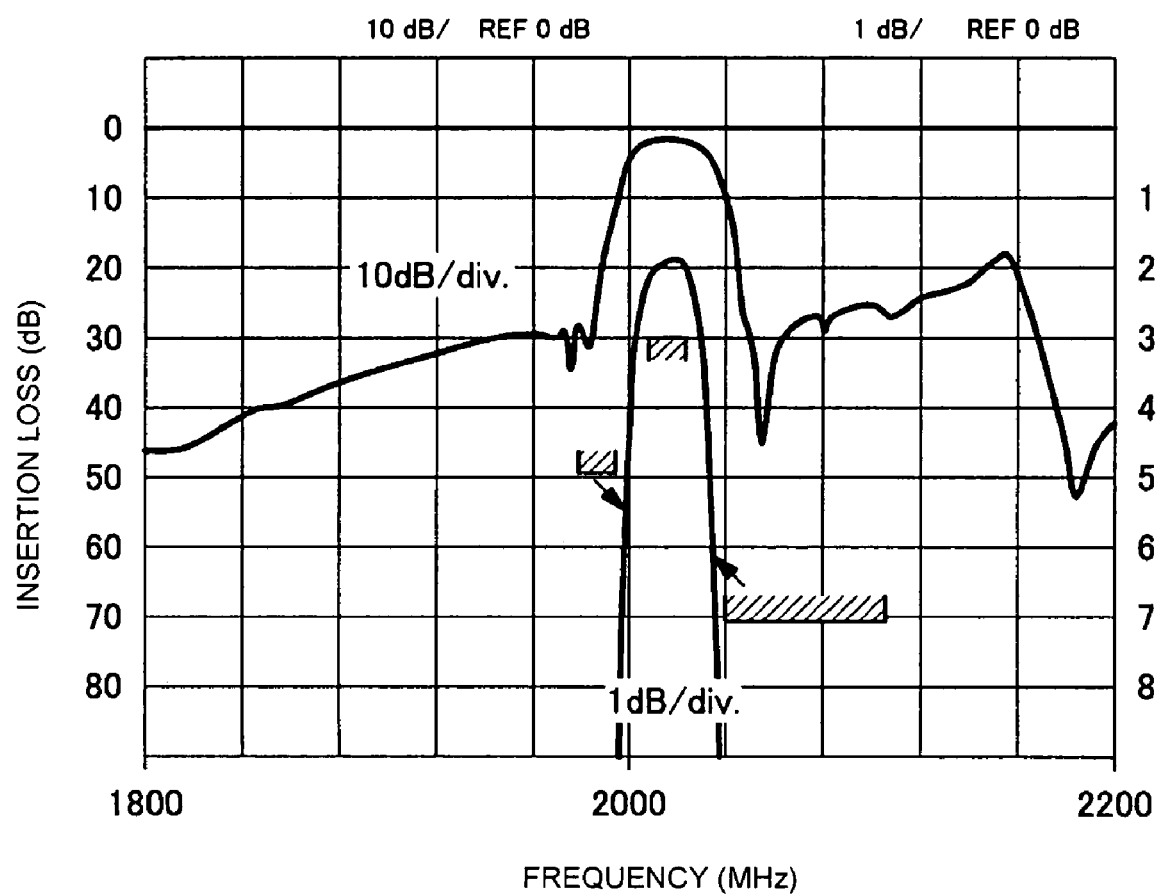
FIG. 7 is a diagram illustrating the transmission characteristic of the SAW device of the second preferred embodiment of the present invention.
Figure 8:
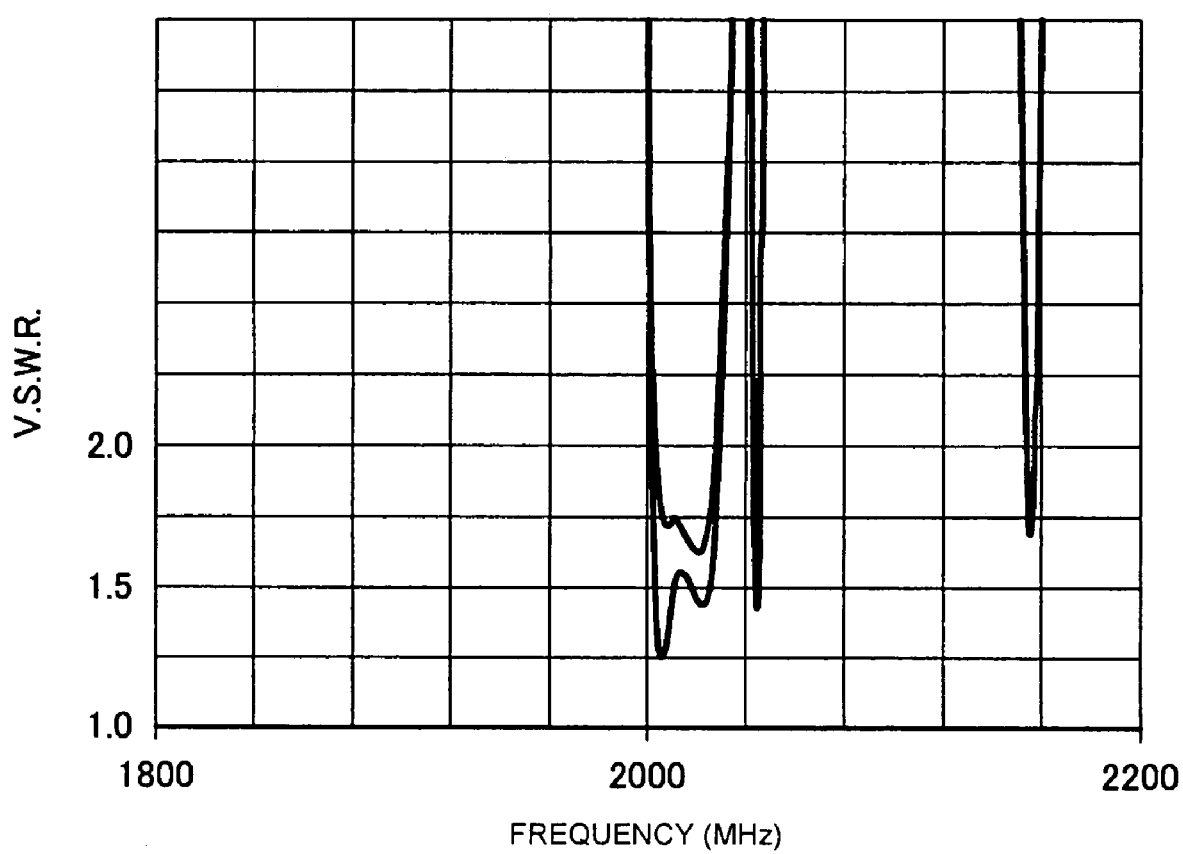
FIG. 8 is a diagram illustrating the VSWR characteristic of the SAW device of the second preferred embodiment of the present invention.

The transmission characteristic and the VSWR characteristic of the second preferred embodiment using the above-described parameters are shown in FIGS. 7 and 8, respectively. The transmission characteristic shown in FIG. 7 indicates that a sufficiently narrow band without causing ripples or increasing the insertion loss in the pass band is obtained. In comparison with the transmission characteristic of the first preferred embodiment shown in FIG. 4, no ripples occur in the pass band in FIG. 7. FIG. 8 shows that the VSWR characteristic is about 2.0 or lower in the pass band, which is a sufficient level satisfying commercial requirements.

Figure 6:
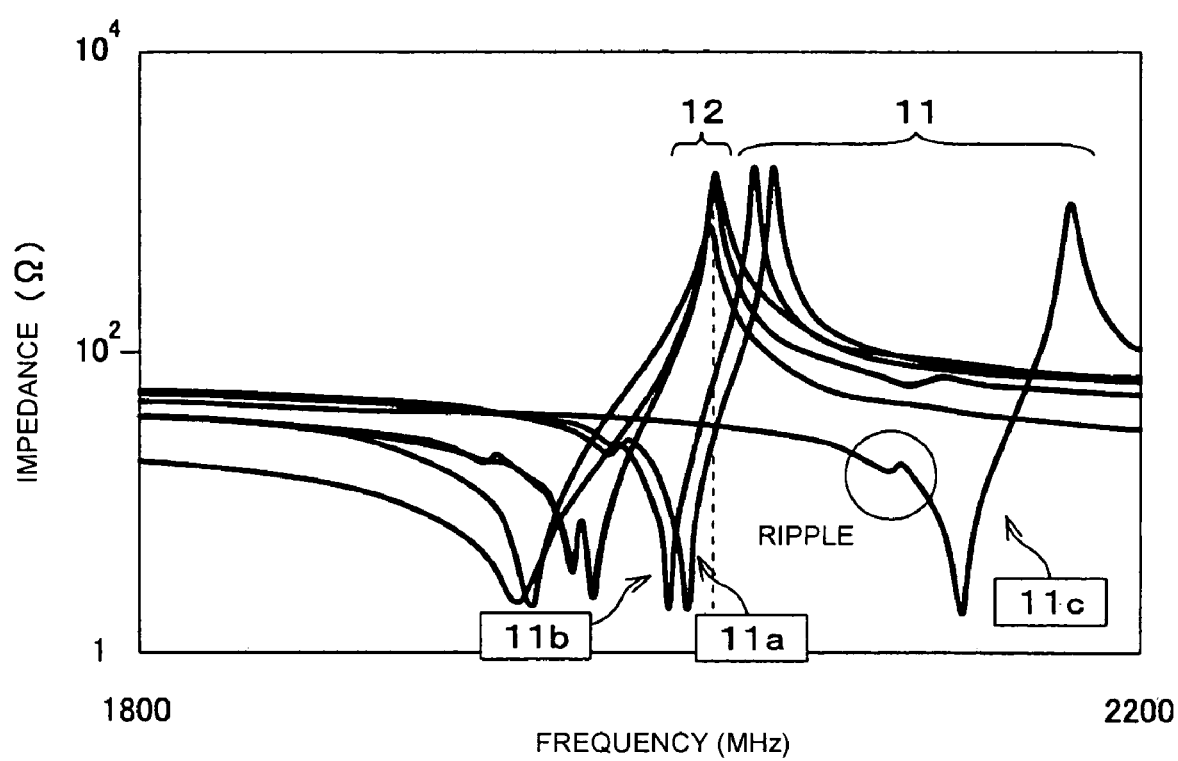
FIG. 6 is a diagram illustrating the impedance characteristics of the resonators used in a SAW device according to a second preferred embodiment of the present invention.

FIG. 6 shows that the resonant frequencies of the series resonators 11a and 11b forming the pass band are set to be lower than the anti-resonant frequency of the parallel resonator group forming the pass band, and that the resonant frequency of only the series resonator 11c is set to be equal to, and more preferably, higher than the anti-resonant frequencies of the series resonators 11a and 11b forming the pass band.

The reason for setting the relationship between the resonant frequency and the anti-resonant frequency of the resonators as described above is as follows. Normally, in one-terminal-pair SAW resonators, as shown in FIG. 6, a ripple corresponding to the vicinity of the lower limit frequency of the stop band of the reflectors occurs in the lower range of the resonant frequency. Accordingly, the resonant frequency of the series resonator 11c is set to be equal to, and more preferably, higher than the anti-resonant frequencies of the other series resonators forming the pass band, thereby excluding the ripple from the pass band. Thus, the occurrence of ripples can be suppressed in the pass band. Alternatively, the anti-resonant frequency of part of the series resonators may be set to be equal to, and more preferably, lower than the resonant frequency of the parallel resonator group forming the pass band, in which case, advantages similar to the above-described advantages can be exhibited.

According to the above-configured ladder-type SAW device of the second preferred embodiment, it is possible to provide a SAW filter having a lower insertion loss, less ripples, and a narrower pass bandwidth than known SAW filters.

Third Preferred Embodiment

A ladder-type SAW device constructed in accordance with a third preferred embodiment of the present invention is described below in the context of a TDS-CDMA filter having a central frequency of 2017.5 MHz. The circuit configuration, the piezoelectric substrate, and the electrode forming method are similar to those of the first preferred embodiment. Elements having functions similar to those of the first and second preferred embodiments are indicated by like reference numerals and like names, and a detailed explanation thereof is thus omitted.

The design parameters of the resonators are as follows. Concerning the IDTs of the series resonators 11a, 11b, and 11c, the electrode pitches are about 2.032 µm, about 1.939 µm, and about 1.871 µm, respectively, the interdigital lengths are about 26 µm, about 26 µm, and about 36 µm, respectively, and the numbers of pairs of electrode fingers are 43, 43, and 43, respectively.

Figure 9:
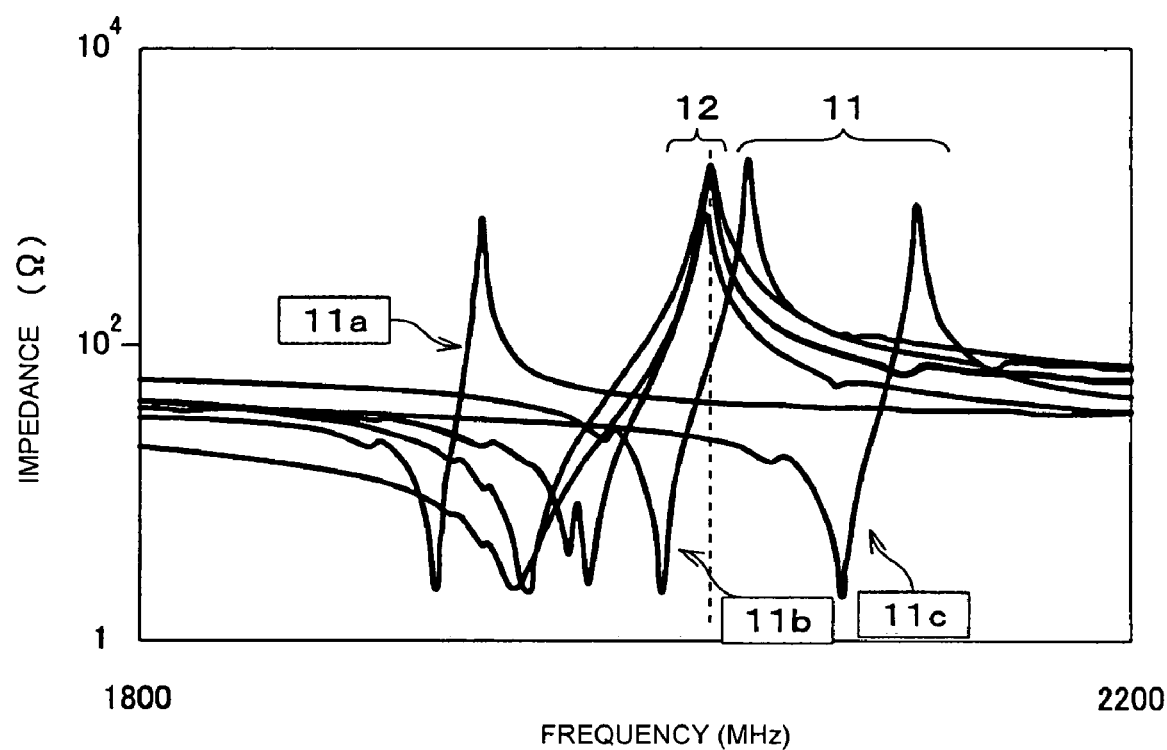
FIG. 9 is a diagram illustrating the impedance characteristics of the resonators used in a SAW device according to a third preferred embodiment of the present invention.

Concerning the IDTs of the parallel resonators 12a, 12b, 12c, and 12d, the electrode pitches are about 1.974 µm, about 1.998 µm, about 1.998 µm, and about 1.974 µm, respectively, the interdigital lengths are about 58.8 µm, about 53.7 µm, about 27.8 µm, and about 56.7 µm, respectively, and the numbers of pairs of electrode fingers are 36, 90, 90, and 36, respectively. The impedance characteristic of the third embodiment using the above parameters is shown in FIG. 9.

Figure 10:
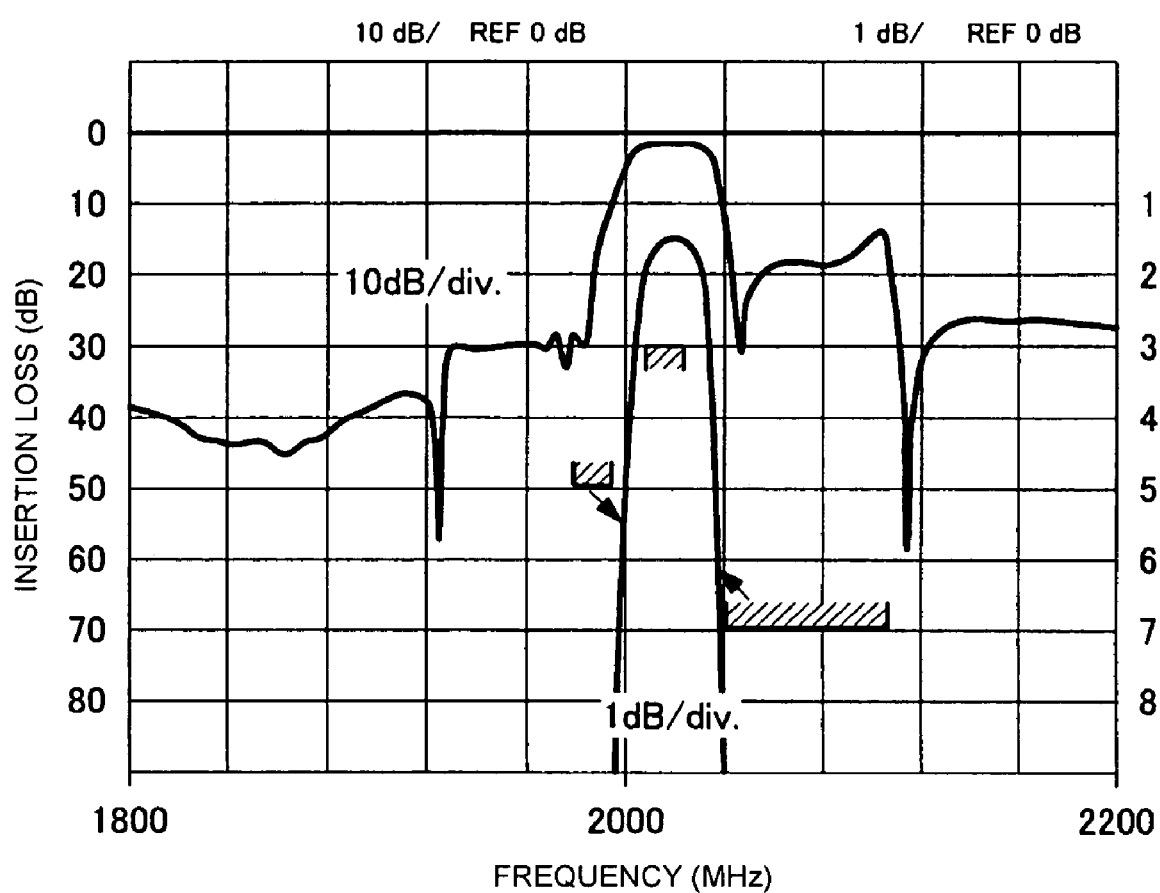
FIG. 10 is a diagram illustrating the transmission characteristic of the SAW device of the third preferred embodiment of the present invention.
Figure 11:
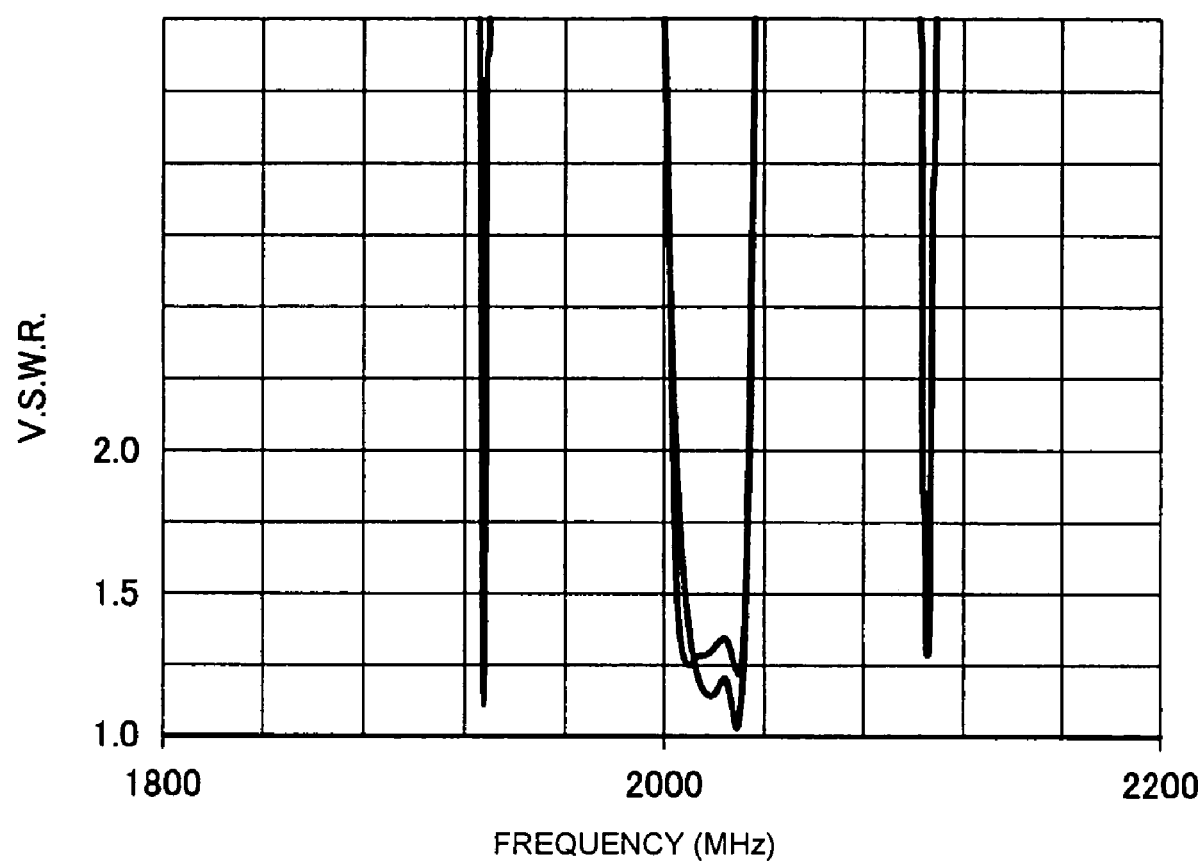
FIG. 11 is a diagram illustrating the VSWR characteristic of the SAW device of the third preferred embodiment of the present invention.

The transmission characteristic and the VSWR characteristic of the third preferred embodiment using the above parameters are shown in FIGS. 10 and 11, respectively. The transmission characteristic shown in FIG. 10 indicates that a sufficiently narrow band without causing ripples or increasing the insertion loss in the pass band is obtained.

FIG. 11 shows that an improved VSWR characteristic is obtained than that of the second preferred embodiment. FIG. 9 reveals that the resonant frequency of part of the series resonators, and more specifically, the series resonator 11b forming the pass band is equal to, and more preferably, lower than the anti-resonant frequency of the parallel resonator group forming the pass band; the anti-resonant frequency of the series resonator 11a is equal to, and more preferably, lower than the resonant frequency of the parallel resonator group; and the resonant frequency of the series resonator 11c is equal to, and more preferably, higher than the anti-resonant frequency of the series resonator 11b forming the pass band. The reason for setting the relationship between the resonant frequency and the anti-resonant frequency of the resonators as described above is as follows.

In order to improve the VSWR characteristic, it is desirable that the inductive areas of at least two series resonators of the series resonator group be disposed at both sides of the pass band. With this arrangement, the impedances of the two series resonators disposed at both sides of the pass band are different from each other, and thus, the flexibility to adjust the impedances is increased, thereby easily providing impedance matching. As a result, in this preferred embodiment, the VSWR characteristic can be improved over that of the second preferred embodiment.

According to the ladder-type SAW device of the third preferred embodiment, it is possible to provide a SAW filter having a lower insertion loss, less ripples, an improved VSWR characteristic, and a narrower pass bandwidth than known SAW filters.

Fourth Preferred Embodiment

A ladder-type SAW device constructed in accordance with a fourth preferred embodiment of the present invention is described below in the context of a TDS-CDMA filter having a central frequency of 2017.5 MHz. The circuit configuration, the piezoelectric substrate, and the electrode forming method are similar to those of the first preferred embodiment. Elements having functions similar to those of the first through third preferred embodiments are indicated by like reference numerals and like names, and a detailed explanation thereof is thus omitted.

The design parameters of the resonators are as follows. Concerning the IDTs of the series resonators 11a, 11b, and 11c, the electrode pitches are about 1.930 µm, about 1.937 µm, and about 1.930 µm, respectively, the interdigital lengths are about 26 µm, about 26 µm, and about 26 µm, respectively, and the numbers of pairs of electrode fingers are 43, 43, and 43, respectively.

Concerning the IDTs of the parallel resonators 12a, 12b, 12c, and 12d, the electrode pitches are about 1.974 µm, about 1.984 µm, about 2.102 µm, and about 1.974 µm, respectively, the interdigital lengths are about 58.8 µm, about 53.7 µm, about 87.8 µm, and about 56.7 µm, respectively, and the numbers of pairs of electrode fingers are 36, 60, 60, and 36, respectively. The impedance characteristic of the fourth preferred embodiment using the above parameters is shown in FIG. 12.

Figure 13:
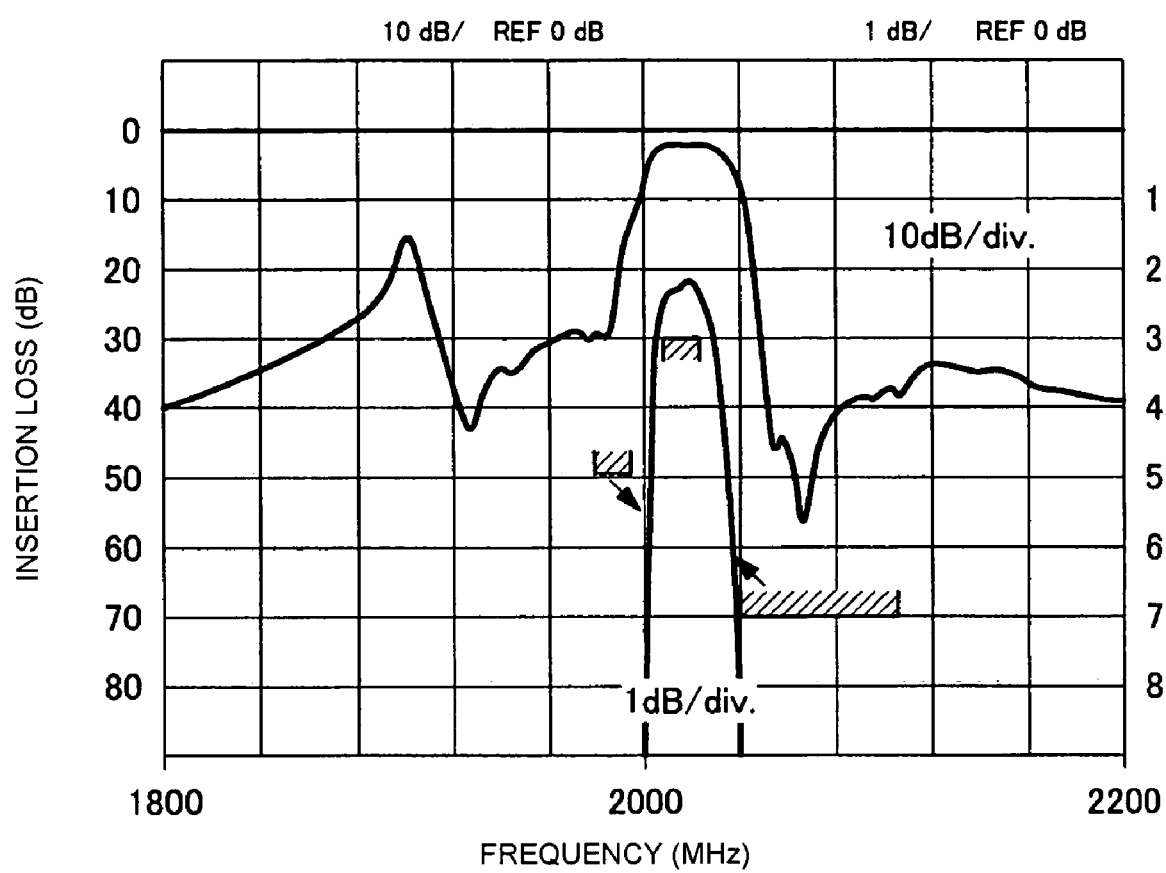
FIG. 13 is a diagram illustrating the transmission characteristic of the SAW device of the fourth preferred embodiment of the present invention.
Figure 14:
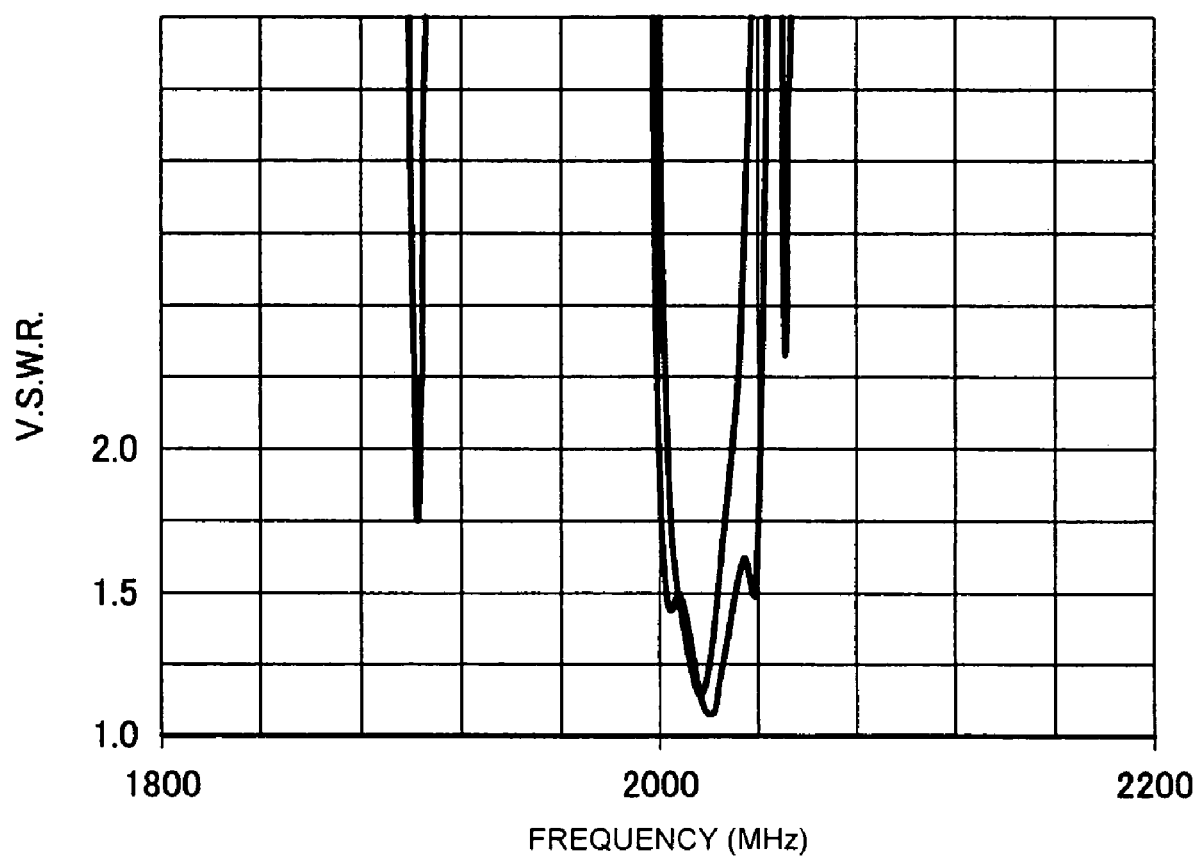
FIG. 14 is a diagram illustrating the VSWR characteristic of the SAW device of the fourth preferred embodiment of the present invention.

The transmission characteristic and the VSWR characteristic of the fourth preferred embodiment using the above-described parameters are shown in FIGS. 13 and 14, respectively. The transmission characteristic shown in FIG. 13 indicates that a sufficiently narrow band without causing ripples or increasing the insertion loss in the pass band is obtained. FIG. 14 shows that the VSWR characteristic is about 2.0 or lower in the pass band, which is a sufficient level satisfying the commercial requirements.

Figure 12:
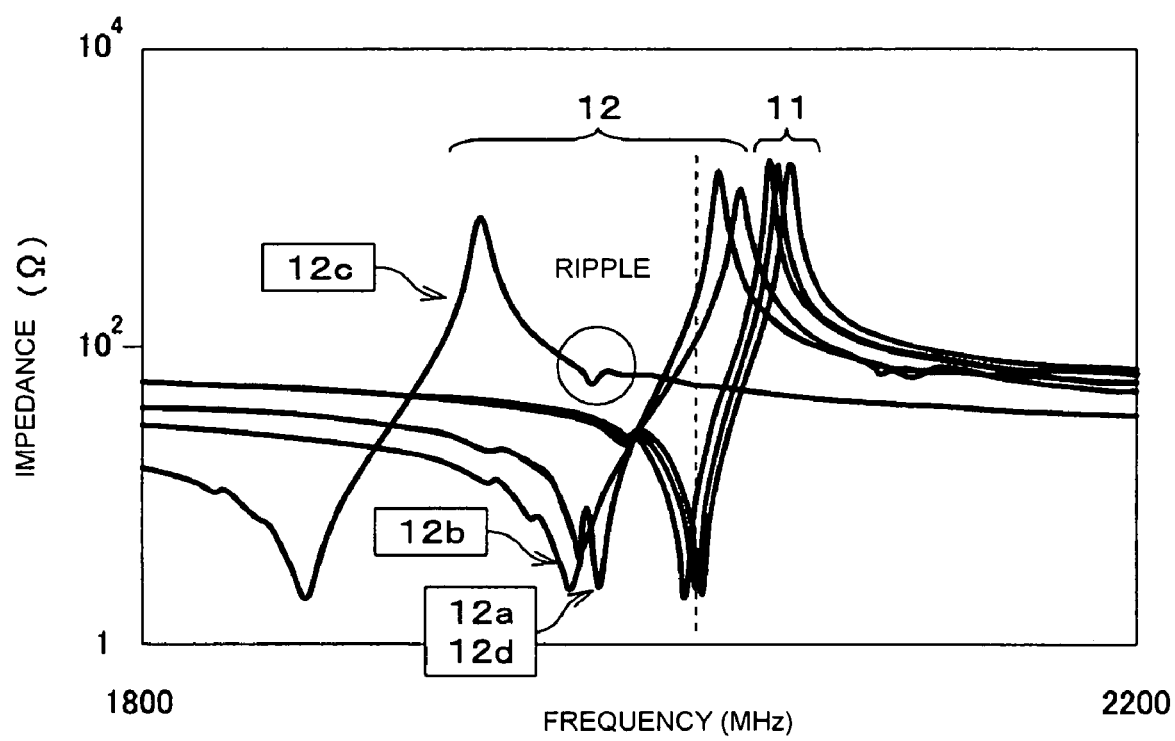
FIG. 12 is a diagram illustrating the impedance characteristics of the resonators used in the SAW device according to a fourth preferred embodiment of the present invention.

FIG. 12 reveals that the anti-resonant frequencies of the parallel resonators 12a, 12b, and 12d forming the pass band are set to be higher than the resonant frequency of the series resonator group forming the pass band, and that the anti-resonant frequency of only the parallel resonator 12c is equal to, and more specifically, lower than the resonant frequencies of the other parallel resonators 12a, 12b, and 12d forming the pass band.

Accordingly, by setting the anti-resonant frequency of part of the parallel resonators to be equal to, and more specifically, lower than the resonant frequency of the series resonator group forming the pass band, matching can be provided in the pass band, as in the first preferred embodiment, and an improved transmission characteristic, such as a lower insertion loss, can be obtained while making the pass bandwidth narrower.

The reason for setting the anti-resonant frequency of part of the parallel resonators to be equal to, and more preferably, lower than the resonant frequencies of the other parallel resonators forming the pass band is to reduce ripples in the pass band.

Normally, in one-terminal-pair SAW resonators, as shown in FIG. 12, a ripple corresponding to the vicinity of the upper limit frequency of the stop band of the reflectors occurs in the higher range of the anti-resonant frequency. Accordingly, by setting the relationship between the anti-resonant frequency and the resonant frequency of the resonators as described above, the ripple can be excluded from the pass band and, thus, the occurrence of ripples can be suppressed in the pass band. Alternatively, the resonant frequency of part of the parallel resonators may be set to be equal to, and more preferably, higher than the anti-resonant frequency of the series resonator group forming the pass band, in which case, advantages similar to the above-described advantages can be exhibited.

Additionally, as in the third preferred embodiment, the inductive areas of two parallel resonators of the parallel resonator group are disposed at both sides of the pass band, thereby providing a filter exhibiting an improved VSWR characteristic.

If the resonant frequency of the parallel resonator 12c is disposed between the anti-resonant frequencies of the parallel resonators 12a, 12b, and 12c forming the pass band and the anti-resonant frequency of the series resonator group forming the pass band, it is located within the pass band, which considerably increases the insertion loss at the right shoulder of the pass band.

According to the above-configured ladder-type SAW device of the fourth preferred embodiment, it is possible to provide a SAW filter having a lower insertion loss and a narrower pass bandwidth than known SAW filters.

In this case, the anti-resonant frequency of part of the parallel resonators is set to be equal to, and more preferably, lower than the resonant frequencies of the other parallel resonators forming the pass band, thereby further reducing ripples in the pass band.

In this case, the inductive areas of two parallel resonators of the parallel resonator group are disposed at both sides of the pass band, thereby further improving the VSWR characteristic.

The SAW device of the present invention can be suitably used as a bandpass filter for a communication apparatus, and more specifically, as a GPS, TDS-CDMA, PHS, or PDC filter that requires narrower bandwidths without increasing the insertion loss, thereby improving the communication characteristics of the communication apparatus.

While the present invention has been described with reference to what are presently considered to be the preferred embodiments, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A surface acoustic wave device comprising:
   series surface acoustic wave resonators; and
   parallel surface acoustic wave resonators, the series surface acoustic wave resonators and the parallel surface acoustic wave resonators being arranged in a ladder configuration; wherein
   the resonant frequency of at least one of the series surface acoustic wave resonators forming a pass band is lower than the anti-resonant frequency of at least one of the parallel surface acoustic wave resonators forming the pass band;
   in an inductive area formed by said at least one of the series surface acoustic wave resonators forming the pass band and said at least one of the parallel surface acoustic wave resonators forming the pass band, a capacitive area of at least one of the series surface acoustic wave resonators that is different from said at least one of the series surface acoustic wave resonators forming the pass band or a capacitive area of at least one of the parallel surface acoustic wave resonators that is different from said at least one of the parallel surface acoustic wave resonators forming the pass band is disposed;
   the resonant frequency of part of the series surface acoustic wave resonators is higher than or equal to the anti-resonant frequency of the parallel surface acoustic wave resonators forming the pass band; and
   the resonant frequency of part of the series surface acoustic wave resonators is set such that ripples produced by the series surface acoustic wave resonators are excluded from the pass band.

2. A communication apparatus comprising the surface acoustic wave device set forth in claim 1.

3. A surface acoustic wave device according to claim 1, wherein the resonant frequency of part of the series surface acoustic wave resonators is higher than or equal to the anti-resonant frequency of the series surface acoustic wave resonators forming the pass band.

4. A surface acoustic wave device according to claim 1, wherein the resonant frequency of part of the parallel surface acoustic wave resonators is higher than or equal to the anti-resonant frequency of the series surface acoustic wave resonators forming the pass band.

5. A surface acoustic wave device according to claim 1, wherein the anti-resonant frequency of part of the parallel surface acoustic wave resonators is lower than or equal to the resonant frequency of the series surface acoustic wave resonators forming the pass band.

6. A surface acoustic wave device according to claim 1, wherein the anti-resonant frequency of part of the series surface acoustic wave resonators is lower than or equal to the resonant frequency of the parallel surface acoustic wave resonators forming the pass band.

7. A surface acoustic wave device according to claim 1, wherein the anti-resonant frequency of part of the parallel surface acoustic wave resonators is lower than or equal to the resonant frequency of the parallel surface acoustic wave resonators forming the pass band.

8. A surface acoustic wave device according to claim 1, wherein the anti-resonant frequency of a first part of the series surface acoustic wave resonators is lower than or equal to the resonant frequency of the parallel surface acoustic wave resonators forming the pass band; and wherein the resonant frequency of a second part of the series surface acoustic wave resonators that is different from the first part of the series surface acoustic wave resonators is higher than or equal to the anti-resonant frequency of the series surface acoustic wave resonators forming the pass band.

9. A surface acoustic wave device according to claim 1, wherein the resonant frequency of a first part of the parallel surface acoustic wave resonators is higher than or equal to the anti-resonant frequency of the series surface acoustic wave resonators forming the pass band; and wherein the anti-resonant frequency of a second part of the parallel surface acoustic wave resonators that is different from the first part of the parallel surface acoustic wave resonators is lower than or equal to the resonant frequency of the parallel surface acoustic wave resonators forming the pass band.

10. A surface acoustic wave device according to claim 1, wherein the resonant frequency of part of the series surface acoustic wave resonators is higher than or equal to the anti-resonant frequency of the series surface acoustic wave resonators forming the pass band; and wherein the anti-resonant frequency of part of the parallel surface acoustic wave resonators is lower than or equal to the resonant frequency of the parallel surface acoustic wave resonators forming the pass band.

11. A surface acoustic wave device according to claim 1, wherein the resonant frequency of part of the parallel surface acoustic wave resonators is higher than or equal to the anti-resonant frequency of the series surface acoustic wave resonators forming the pass band; and wherein the anti-resonant frequency of part of the series surface acoustic wave resonators is less than or equal to the resonant frequency of the parallel surface acoustic wave resonators forming the pass band.

12. A surface acoustic wave device comprising:
   series surface acoustic wave resonators; and
   parallel surface acoustic wave resonators, the series surface acoustic wave resonators and the parallel surface acoustic wave resonators being arranged in a ladder configuration; wherein
   the resonant frequency of at least one of the series surface acoustic wave resonators forming a pass band is lower than the anti-resonant frequency of at least one of the parallel surface acoustic wave resonators forming the pass band;
   between the resonant frequency of at least one of the series surface acoustic wave resonators forming the pass band and the anti-resonant frequency of at least one of the parallel surface acoustic wave resonators forming the pass band, a capacitive area of at least one of the series surface acoustic wave resonators that is different from said at least one of the series surface acoustic wave resonators forming the pass band or a capacitive area of at least one of the parallel surface acoustic wave resonators that is different from said at least one of the parallel surface acoustic wave resonators forming the pass band is disposed;
   the resonant frequency of part of the series surface acoustic wave resonators is higher than or equal to the anti-resonant frequency of the parallel surface acoustic wave resonators forming the pass band; and
   the resonant frequency of part of the series surface acoustic wave resonators is set such that ripples produced by the series surface acoustic wave resonators are excluded from the pass band.

13. A communication apparatus comprising the surface acoustic wave device set forth in claim 12.

14. A surface acoustic wave device according to claim 12, wherein the resonant frequency of part of the series surface acoustic wave resonators is higher than or equal to the anti-resonant frequency of the series surface acoustic wave resonators forming the pass band.

15. A surface acoustic wave device according to claim 12, wherein the resonant frequency of part of the parallel surface acoustic wave resonators is higher than or equal to the anti-resonant frequency of the series surface acoustic wave resonators forming the pass band.

16. A surface acoustic wave device according to claim 12, wherein the anti-resonant frequency of part of the parallel surface acoustic wave resonators is lower than or equal to the resonant frequency of the series surface acoustic wave resonators forming the pass band.

17. A surface acoustic wave device according to claim 12, wherein the anti-resonant frequency of part of the series surface acoustic wave resonators is lower than or equal to the resonant frequency of the parallel surface acoustic wave resonators forming the pass band.

18. A surface acoustic wave device according to claim 12, wherein the anti-resonant frequency of part of the parallel surface acoustic wave resonators is lower than or equal to the resonant frequency of the parallel surface acoustic wave resonators forming the pass band.

19. A surface acoustic wave device according to claim 12, wherein the anti-resonant frequency of a first part of the series surface acoustic wave resonators is lower than or equal to the resonant frequency of the parallel surface acoustic wave resonators forming the pass band; and wherein the resonant frequency of a second part of the series surface acoustic wave resonators that is different from the first part of the series surface acoustic wave resonators is higher than or equal to the anti-resonant frequency of the series surface acoustic wave resonators forming the pass band.

20. A surface acoustic wave device according to claim 12, wherein the resonant frequency of a first part of the parallel surface acoustic wave resonators is higher than or equal to the anti-resonant frequency of the series surface acoustic wave resonators forming the pass band; and wherein the anti-resonant frequency of a second part of the parallel surface acoustic wave resonators that is different from the first part of the parallel surface acoustic wave resonators is lower than or equal to the resonant frequency of the parallel surface acoustic wave resonators forming the pass band.

21. A surface acoustic wave device according to claim 12, wherein the resonant frequency of part of the series surface acoustic wave resonators is higher than or equal to the anti-resonant frequency of the series surface acoustic wave resonators forming the pass band; and wherein the anti-resonant frequency of part of the parallel surface acoustic wave resonators is lower than or equal to the resonant frequency of the parallel surface acoustic wave resonators forming the pass band.

22. A surface acoustic wave device according to claim 12, wherein the resonant frequency of part of the parallel surface acoustic wave resonators is higher than or equal to the anti-resonant frequency of the series surface acoustic wave resonators forming the pass band; and wherein the anti-resonant frequency of part of the series surface acoustic wave resonators is less than or equal to the resonant frequency of the parallel surface acoustic wave resonators forming the pass band.

* * * * *